United States Patent [19]

Evert

[11] Patent Number: 5,621,359

[45] Date of Patent: Apr. 15, 1997

[54] GAIN SELECTION TECHNIQUE

[75] Inventor: Benjamin H. Evert, Bethlehem, Pa.

[73] Assignee: Lucent Technologies Inc., Murray Hill, N.J.

[21] Appl. No.: 507,894

[22] Filed: Jul. 27, 1995

[51] Int. Cl.$^6$ .................................................... H03G 3/20
[52] U.S. Cl. ........................................ 330/284; 330/134
[58] Field of Search ...................................... 330/129, 278, 330/279, 284, 134

[56] References Cited

U.S. PATENT DOCUMENTS

| | | | |
|---|---|---|---|
| 4,924,193 | 5/1990 | Saito et al. | 330/284 |
| 5,075,633 | 12/1991 | Bowers | 330/284 X |
| 5,486,791 | 1/1996 | Spitalny et al. | 330/284 X |

OTHER PUBLICATIONS

Patent No. EP-A-O 163 409, issued in EPO on 4 Dec. 1985.
Patent No. EP-A-0 095 774, issued in EPO on 7 Dec. 1983 to Miyata, Shinji.

Kadaba R. Laksmikumar et al., "A Baseband Codec for Digital Cellular Telephony", IEEE Journal of Solid-State Circuits, 26 Dec. 1991, No. 12, pp. 1952–1957.

*Primary Examiner*—Steven Mottola
*Attorney, Agent, or Firm*—James H. Fox

[57] ABSTRACT

An integrated circuit includes a gain control terminal that provides for a choice of discrete gain values for circuitry on the IC. Typically, the gain control terminal is connected to a high voltage source ($V_{DD}$), or a low voltage source ($V_{SS}$), or optionally left unconnected. In addition, the integrated circuit provides a gain set terminal for connection to an external impedance, typically a resistor, and also includes gain set circuitry for determining the value of the resistor as falling within one range out of several possible ranges. Based upon the range thus determined, the gain set circuitry selects the discrete gain values that are available for choice by the gain control terminal. In this manner, a large range of gain values are available for use even though only a few need to be selected in actual operation of the IC. This technique minimizes external package terminals for the IC, and allows for gain setting by low tolerance resistors.

8 Claims, 1 Drawing Sheet

FIG.
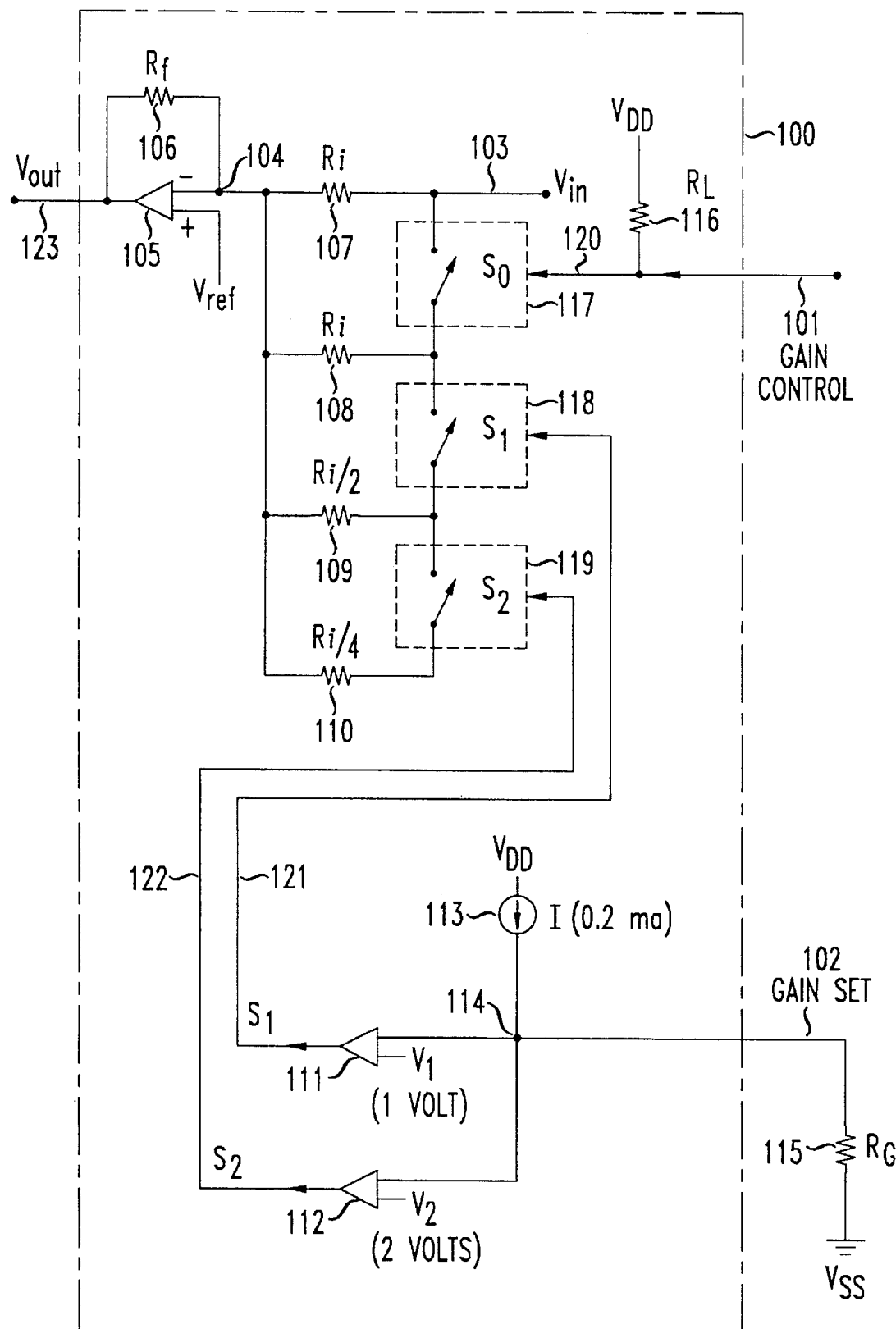

GAIN SELECTION TECHNIQUE

BACKGROUND OF THE INVENTION

1. Field of the Invention

The present invention relates to a technique for selecting the gain of a circuit.

2. Description of the Prior Art

Integrated circuits (ICs) often include circuitry that allow for adjustment of the gain of one or more stages. For example, a CODEC (coder-decoder) of the type used in telephones may provide for gain adjustment. Typically, the gain of an amplifier that receives an analog signal from the microphone and provides it to an analog-to-digital (A/D) converter (the "encoder") may be adjusted. Furthermore, the gain of another amplifier that receives the output from a digital-to-analog (D/A) converter (the "decoder") and supplies it to a speaker may be adjusted. In many cases, a wide range of gains are possible by the appropriate choice of resistor values. For example, the gain may be determined by the value of a feedback resistor relative to an input resistor of an operational amplifier. However, implementing the capability to easily choose resistor values may require that integrated circuit package terminals be devoted to connection to one or more external resistors if the user of the IC is to be allowed the choice of gain values. The number of terminals that is required is increased if several CODECs are formed on a single integrated circuit. Alternatively, the gain may be pre-set during the fabrication of the integrated circuit, as by a metal mask option or blowing of fuses to set the values of resistors required. This reduces or eliminates the number of package terminals required for connection to external resistors, but limits the flexibility of use of the IC after it is manufactured, since the user may not be able to change gain values of the internal circuitry.

A wide range of gain values (e.g., 0 to 23 dB) may be accommodated by the choice of resistor values, whether the resistors are selected off-chip or on-chip as noted above. Programmable CODECs use a register to allow setting the gain in steps (e.g., 0.1 dB). However, programmable CODECs use a serial interface that requires a number of IC package pins (e.g., data, clock, and read/write), and a number of control pins. They typically also require random access memory and decoding logic. However, in practice, a given user may need to change between only a relatively small number of gain values in actual operation of a device. For example, CODECs used in telephone sets usually provide a "mute" or "conference mode" capability to reduce the gain of the handset speaker amplifier and microphone amplifier, so that a phone conversation may be temporarily interrupted without hanging up the phone. In that case, only two gain values are under the control of the telephone user by means of a pushbutton. However, different manufacturers of telephone sets may wish to choose different values of these two different gains, as for compensating for the differing sensitivities of other circuit components, for example. Therefore, it is desirable to provide a choice of gain values using a minimal number of integrated circuit package terminals while still allowing for the choice of a range of gain values.

SUMMARY OF THE INVENTION

I have invented a gain control technique wherein an integrated circuit includes a gain control terminal that may be connected to a high or low voltage source to select a discrete gain from at least two possible gain values for circuitry on the IC. In addition, the integrated circuit provides a gain set terminal for connection to an external impedance device (typically a resistor), and also includes gain set circuitry for determining the value of the impedance as falling within one range out of several possible ranges of values. Based upon the range thus determined, the gain set circuitry selects the magnitude of at least one of the possible gain values that are available for choice by the gain control terminal.

BRIEF DESCRIPTION OF THE DRAWING

The FIGURE shows an illustrative embodiment of the invention.

DETAILED DESCRIPTION

The following detailed description relates to a technique for selecting the gain of circuitry on an integrated circuit. While the gain of an operational amplifier will be illustrated herein, it will be appreciated that the present technique may be used for control of other types of amplifiers. Referring to the Figure, an integrated circuit 100 includes an operational amplifier 105 that drives an output terminal 123 to provide an output signal $V_{out}$ to external circuitry (not shown). The gain of the operational amplifier relative to the input voltage $V_{in}$ on input node 103 is set by the ratio of the feedback resistor $R_f$ (106) to the effective input resistance. The effective input resistance includes the value of resistor 107 ($R_i$) and whichever ones (if any) of resistors 108, 109 and 110 are switched in parallel with resistor 107. For convenience of explanation herein, it will be assumed that $R_f=R_i$, although other relative values are possible. The resistors 108, 109 and 110 are connected to the input node 103 by switches $S_0$, $S_1$ and $S_2$ (117, 118, 119, respectively). As used illustratively herein, a given switch is closed (i.e., conducting) when the voltage on the associated control line (120, 121, 122 respectively) is high (e.g., $V_{DD}$), and is open (i.e., non-conducting) when the voltage on the associated control line is low (e.g., $V_{SS}$).

The Gain Control terminal 101 is used to control switch $S_0$ (117), which selects whether any of the resistors 108, 109 and 110 are switched in parallel with resistor 107. When an external conductor (not shown) is connected by the user of the integrated circuit from terminal 101 to a low voltage, e.g. ground ($V_{SS}$), the voltage on terminal 101 and switch control line 120 is pulled low, thereby causing switch $S_0$ to open. When $S_0$ is open, only resistor 107 is effectively in the input path of the operational amplifier, and hence the voltage gain is equal to 1 (0 dB), since $R_f=R_i$ as noted above. However, the voltage on terminal 101 and switch control line 120 is pulled high ($V_{DD}$) by load resistor $R_L$ (116) when there is no external connection to terminal 101, thereby causing switch $S_0$ to close. In that case, the effective input resistance is also influenced by whether $S_1$ is closed, and further influenced by whether $S_2$ is closed, as discussed below. The load resistor 116 may alternatively be connected to ground, in which case an external connection to a high voltage, e.g., $V_{DD}$, is required to change the switch state.

The switches $S_1$ and $S_2$ are controlled by the "gain set" circuitry that comprises comparators 111 and 112 and current source 113 connected to node 114 as illustrated. An external gain setting resistor 115 having a value $R_G$ is connected between terminal 102 and ground ($V_{SS}$). Therefore, the voltage on node 114 with respect to ground is determined by the value of resistor 115 and the value of I from the current source 113 according to the formal V=I×

$R_G$. The voltage on node 114 is compared by comparator 111 to a first reference voltage $V_1$, illustratively 1 volt. The voltage on node 114 is compared by comparator 112 to a second reference voltage $V_2$, illustratively 2 volts. When the voltage on node 114 exceeds a given reference voltage, the output of the corresponding comparator goes high, thereby closing the associated switch. This changes the gain of the operational amplifier by changing the effective input resistance.

For example, assume that I=0.2 ma in an illustrative case. Then, as shown in the TABLE below, when the value of gain setting resistor 115 is in the range of 0 to 5 kilohms, the voltage on node 114 is in the range of 0 to 1 volts, and both comparators 111 and 112 provide low outputs to switch control lines 121, 122, so that both $S_1$ and $S_2$ are open. When the value of resistor 115 is in the range of 5 to 10 kilohms, the voltage on node 114 is in the range of 1 to 2 volts, exceeding the value of $V_1$. Therefore, comparator 111 places a high voltage on switch control line 121, causing switch $S_1$ to close, placing resistor 109 in parallel with resistor 108. When the value of resistor 115 is greater than 10 kilohms, then the voltage on node 114 exceeds 2 volts, exceeding the value of $V_2$. Therefore, comparators 111 and 112 place high voltages on both switch control lines 121 and 122, causing both switches $S_1$ and $S_2$ to close, placing both resistors 109 and 110 in parallel with resistor 108. It can therefore be seen that if switch $S_0$ is closed as discussed above, then either resistor 109, or both resistor 109 and resistor 110, are effectively placed in parallel with resistors 107 and 108. Therefore, the gain of the operational amplifier is controlled according to both the connection state of gain control terminal 101 as well as the value of resistor 115.

TABLE

| | Gain of Operational Amplifier | |
|---|---|---|
| $R_G$ | $S_0$ = open | $S_0$ = closed |
| 0–5 kohms | 0 dB | 6 dB |
| 5–10 kohms | 0 dB | 12 dB |
| >10 kohms | 0 dB | 18 dB |

One advantage of the inventive technique is that the value of the gain setting resistor 115 need not be tightly controlled if the references voltages $V_1$ and $V_2$ are chosen appropriately. Therefore, a user of the integrated circuit may illustratively use low tolerance (e.g., ±10%) resistors if desired, although higher tolerance resistors may be used if a large number of additional ranges are desired. Note that the inventive technique provides the desired ability to chose the gain over a wide range of values, while requiring only a relatively small number of external terminals of the IC. In addition, it is apparent that a number of additional amplifiers may be similarly controlled from the same gain setting circuitry, by routing the switch control lines 120, 121 and 122 to such other amplifiers. These other amplifiers may be output amplifiers as shown, or alternatively may be input amplifiers, or a combination thereof. In fact, the amplifiers may be internal to the IC and not communicate directly with external devices if desired. Of course, separate gain control circuitry and associated IC terminals may be similarly provided to independently set that gains of the various amplifiers if desired.

The gain control terminal 101 has been described above as providing for the selection of two possible gain values, depending on whether the voltage on the gain control terminal is high or low. However, a third gain value may be readily provided by a high impedance option, wherein additional circuitry (not shown) is provided in the IC 100 to determine if the terminal is left unconnected. This additional circuitry, of a type known in the art, may simply bias the terminal at a value of ½ $V_{DD}$, and then determine whether it remains at this value, as when the terminal is unconnected, or is pulled to $V_{DD}$ or $V_{SS}$ by an external connection. Furthermore, while a single gain control terminal 101 is illustrated, two or more terminals may be used for selecting additional discrete gain values.

While the illustrative embodiment has shown resistors in the feedback and input circuitry of an operational amplifier, other impedance elements may be used to control that gain. For example, the gain of an amplifier used in a switched capacitor filter circuit may be conveniently set by switching in capacitors in lieu of the resistors shown. The capacitors provide an effective impedance based upon the value of the capacitors and the rate of a high frequency clock that serves to provide an AC switching signal, in contrast to the DC switches illustrated herein. Therefore, the impedance that controls the gain may be provided according to the type of amplifier involved. Similarly, while the illustrative embodiment has shown an external resistor for setting the gain available for control by the gain control terminal, other impedance devices are possible. For example, a capacitor may be used as the gain setting impedance device, with an AC current source signal being applied to the capacitor in lieu of the DC current source shown herein. In that case, the magnitude of the resulting AC voltage across the capacitor may be determined by appropriate circuitry known in the art. The gain that is set is non frequency-selective in the illustrative case, but may alternatively provide differing gains for differing frequencies, in which case filter characteristics may be changed. Still other applications of the present invention will be apparent to persons of skill in the art.

The invention claimed is:

1. An integrated circuit comprising an amplifier having a gain that may be selected from a plurality of discrete values, characterized in that said integrated circuit provides a control terminal for connection to one of two or more voltage sources in order to select a discrete gain value, and a gain set terminal for connection to a gain setting impedance device;

wherein said integrated circuit includes a gain setting circuit comprising at least a first comparator having a first input coupled to said gain set terminal and a second input coupled to receive a first reference voltage for determining which range of two or more impedance ranges includes the impedance of said impedance device, and for providing a discrete gain value associated with said range for selection by said control terminal.

2. The invention of claim 1 wherein said control terminal is pulled toward a high voltage level by a resistance, whereby said discrete gain value is a first value when said control terminal is unconnected and is a second value when said control terminal is connected to a low voltage source.

3. The invention of claim 1 wherein said control terminal is pulled toward a low voltage level by a resistance, whereby said discrete gain value is a first value when said control terminal is unconnected and is a second value when said control terminal is connected to a high voltage source.

4. The invention of claim 1 wherein said control terminal is maintained at an intermediate voltage when said control terminal is unconnected, whereby said discrete gain value is a first value when said control terminal is unconnected and is a second value when said control terminal is connected to a low voltage source and is a third value when said control terminal is connected to a high voltage source.

5. The invention of claim 1 wherein said impedance device is a resistor.

6. The invention of claim 1 wherein said gain setting circuit further comprises a second comparator having a first input coupled to said gain set terminal and a second input coupled to receive a second reference voltage that is different than said first reference voltage.

7. The invention of claim 1 wherein said integrated circuit further comprises a current source for flowing current through said gain setting impedance device, whereby a voltage is developed at said first input of said first comparator.

8. The invention of claim 1 wherein said impedance device is a resistor, and said gain setting circuit further comprises a second comparator having a first input coupled to said gain set terminal and a second input coupled to receive a second reference voltage that is different than said first reference voltage, and wherein said integrated circuit further comprises a current source for flowing current through said resistor, whereby a voltage is developed at said first input of said first comparator and said first input of said second comparator.

* * * * *